United States Patent [19]
Miyatake

[11] Patent Number: 5,189,639
[45] Date of Patent: Feb. 23, 1993

[54] SEMICONDUCTOR MEMORY DEVICE HAVING BIT LINES CAPABLE OF PARTIAL OPERATION

[75] Inventor: Hideshi Miyatake, Hyogo, Japan

[73] Assignee: Mitsubishi Denki Kabushiki Kaisha, Tokyo, Japan

[21] Appl. No.: 784,105

[22] Filed: Oct. 29, 1991

Related U.S. Application Data

[63] Continuation of Ser. No. 584,418, Sep. 17, 1990, abandoned, which is a continuation of Ser. No. 269,765, Nov. 10, 1988, abandoned.

[30] Foreign Application Priority Data

Nov. 26, 1987 [JP] Japan ................................ 62-297979

[51] Int. Cl.$^5$ ............................................. G11C 11/24
[52] U.S. Cl. .................................. 365/149; 365/205; 365/203
[58] Field of Search ............... 365/190, 149, 202, 205, 365/207, 208, 227, 203

[56] References Cited

U.S. PATENT DOCUMENTS

| | | | |
|---|---|---|---|
| 4,498,154 | 2/1985 | Hoffmann | 365/149 |
| 4,546,457 | 10/1985 | Nozaki et al. | 365/190 X |
| 4,606,010 | 8/1986 | Saito | 365/149 |
| 4,680,734 | 7/1987 | Baba et al. | 365/190 |
| 4,792,927 | 12/1988 | Miyamoto et al. | 365/149 X |
| 4,799,197 | 1/1989 | Kodama et al. | 365/149 X |

OTHER PUBLICATIONS

Hiroshi Kawamoto et al., "A 288K CMOS Pseudostatic RAM" IEEE Journal of Solid-State Circuits, vol. SC-19, No. 5, pp. 619-623, Oct. 1984.

*Primary Examiner*—Andrew L. Sniezek
*Attorney, Agent, or Firm*—Lowe, Price, Le Blanc & Becker

[57] ABSTRACT

Transfer transistors are connected midway on respective bit lines of a bit line pair. Memory cells are provided for a first bit line pair and a second bit line pair partitioned by the transfer transistor, and a sense amplifier is connected to the first bit line pair. When a memory cell connected to the first bit line pair is selected, the transfer transistor turns off. Therefore, the potential difference appears only on the first bit line pair, with the potentials amplified by the sense amplifier. In this state, the potential of the second bit line pair is not changed and not amplified.

11 Claims, 8 Drawing Sheets

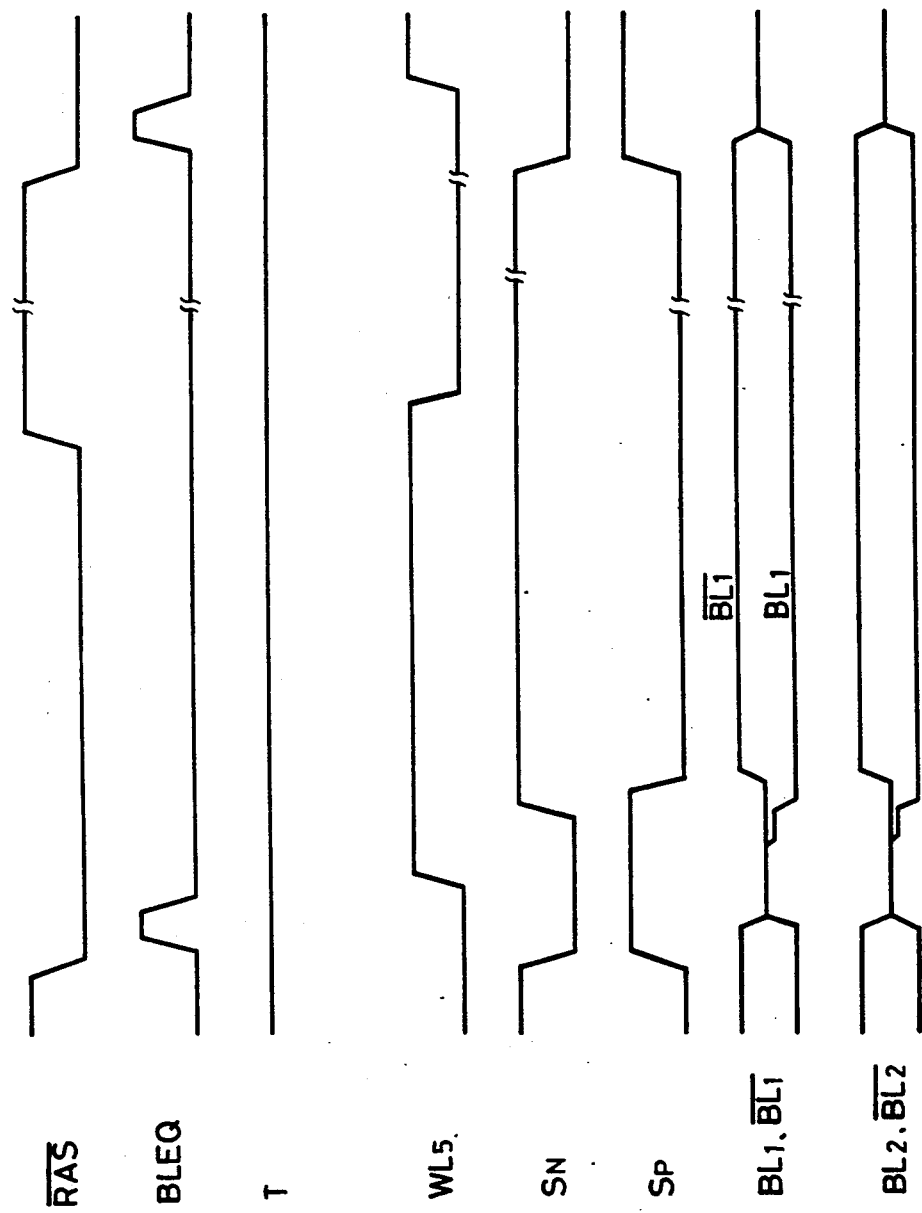

SEMICONDUCTOR MEMORY DEVICE HAVING BIT LINES CAPABLE OF PARTIAL OPERATION

This application is a continuation application of application Ser. No. 07/584,418, filed Sep. 17, 1990, now abandoned which is a continuation application of application Ser. No. 07/269,765, filed Nov. 10, 1988 now abandoned.

BACKGROUND OF THE INVENTION

1. Field of the Invention

The present invention relates to semiconductor memory devices and, more specifically, to semiconductor memory devices whose bit lines can be partially operated. Description of the Prior Art Semiconductor memory devices have been remarkably developed, and various technologies have been proposed to reduce power consumption of random access memories (RAM).

FIG. 1 is a block diagram showing an example of a conventional DRAM structure. Referring to the figure, a memory cell array 101 comprises a plurality of word lines and a plurality of bit lines intersecting with each other, with memory cells arranged at respective intersections between the word lines and the bit lines. By selecting one word line by means of a X address buffer decoder 102 and by selecting one bit line by means of a Y address buffer decoder 103, a memory cell at the intersection can be selected. Data is written to the selected memory cell and the data stored in the memory cell is read therefrom. The writing/reading of data is carried out by a reading/writing control signal (R/W) provided to a R/W control circuit 104. In writing data, an input data ($D_{in}$) is inputted to the selected memory cell through the R/W control circuit 104. In data reading, the data stored in the selected memory cell is detected and amplified by a sense amplifier 105 to be externally outputted as an output data (Dout) through a data output buffer 106.

FIG. 2 is a schematic diagram showing a conventional bit line pair included in the memory cell array of FIG. 1, which is disclosed in, for example, "A 288K CMOS Pseudostatic RAM" IEEE Journal of Solid-State Circuits, Vol. SC-19, No. 5, pp 619–623, October 1984.

Referring to the figure, a plurality of word lines (only word lines $WL_1$, $WL_2$, $WL_5$, and $WL_6$ are shown) are arranged to intersect the bit line pair BL and $\overline{BL}$, and memory cells MC (only memory cells $MC_1$, $MC_2$, $MC_5$ and $MC_6$ are shown) are provided at the intersections of respective the bit lines BL and $\overline{BL}$ and the word lines WL. Since each memory cell has the same structure, description will be given only of the memory cell $MC_1$ at the intersection with the word line $WL_1$. The memory cell $MC_1$ comprises a transfer transistor $Q_{S1}$ and a memory capacitor $C_1$. The transistor $Q_{S1}$ is connected between the memory capacitor $C_1$ and the bit line BL or $\overline{BL}$ with the gate connected to the word line $WL_1$.

An N type sense amplifier NSA and a P type sense amplifier PSA constituting the sense amplifier 105 are connected to the bit line pair BL, $\overline{BL}$. The N type sense amplifier NS comprises N channel MOS transistors Q1 and Q2. The transistor Q1 is connected between the bit line $\overline{BL}$ and a node N1 with the gate connected to the bit line BL. The transistor Q2 is connected between the bit line BL and the node N1 with the gate connected to the bit line $\overline{BL}$. The node N1 is coupled to the ground potential through an N channel MOS transistor Q3 with a sense amplifier activating signal $S_N$ applied to the gate of the transistor Q3. The P type sense amplifier PSA comprises P channel MOS transistors Q4 and Q5. The transistor Q4 is connected between the bit line $\overline{BL}$ and a node N2 with the gate connected to the bit line BL. The transistor Q5 is connected between the bit line BL and the node N2 with the gate connected to the bit line $\overline{BL}$. The node N2 is coupled to a supply potential $V_{cc}$ through a P channel MOS transistor Q6 with a sense amplifier activating signal $S_p$ applied to the gate of the transistor Q6. An N channel MOS transistor Q7 for equalization is connected between the bit line pair BL and $\overline{BL}$, with an equalizing signal BLEQ applied to the gate thereof.

FIG. 3 is a diagram of waveforms showing the operation of FIG. 2. The operation of the circuit shown in FIG. 2 will be described with reference to the diagram of waveforms. The operation when the word line $WL_1$ is selected is shown in this example. When a row address strobe signal $\overline{RAS}$ is at the "H" level, that is, in an off time period, the sense amplifier activating signal $S_N$ becomes "H" level and the sense amplifier activating signal $S_P$ becomes "L" level, so that the sense amplifiers NSA and PSA are in the active state. Consequently, the potential of one of the bit lines BL and $\overline{BL}$ is held at the "H" level, namely, $V_{cc}$ potential, and the potential of the other one is held at the "L" level, namely, the ground potential.

When the row address strobe signal $\overline{RAS}$ is at the "L" level, that is, in the active period, first, the sense amplifier activating signal $S_N$ is set at the "L" level and the sense amplifier activating signal $S_P$ is set at the "H" level to bring the sense amplifiers NSA and PSA to inactive state, and thereafter the equalizing signal BLEQ is once set at the "H" level so as to short-circuit the bit line pair BL and $\overline{BL}$. Consequently, the potential of the bit line BL and that of the bit line $\overline{BL}$ are both brought to an intermediate potential (precharge potential), that is, $\frac{1}{2} V_{cc}$, which is an intermediate potential between the "H" level and the "L" level. The equalizing signal BLEQ is reset at the "L" and thereafter, a word line driving signal $WL_1$ rises to the "H" level. Consequently, the information in the memory cell $MC_1$ connected to the selected word line $WL_1$ is read to the corresponding bit line BL, and the potential of the bit line BL slightly increases or decreases in accordance with the information of the memory cell $MC_1$. On this occasion, the potential of the bit line $\overline{BL}$ to which the selected memory cell $MC_1$ is not connected is kept at the above described precharge potential. When the sense amplifier activating signal $S_N$ is set at the "H" level and the sense amplifier activating signal SP is set at the "L" level to activate the sense amplifiers NSA and PSA, the potential difference between the bit lines BL and $\overline{BL}$ is amplified. The amplifying operation will be more specifically described with reference to a case in which the potential of the bit line BL is higher than that of the bit line $\overline{BL}$. The transistor Q1 is turned on by the potential of the bit line BL, and the bit line $\overline{BL}$ is connected to the ground voltage through the node N1 and the transistor Q3. The transistor Q5 turns on by the bit line $\overline{BL}$ which has become the ground potential, and bit line BL is connected to the power supply voltage through the transistor Q5, the node N2 and the transistor Q6. Consequently, the bit line BL or $\overline{BL}$ which has the higher potential (in this case the bit line BL) is fixed at the "H" level, and the bit line having the lower potential (in this case the bit line $\overline{BL}$) is fixed at the "L" level. The refresh and reading operation of the memory cell MC$_1$ is carried out in this manner. Thereafter, when the row address strobe signal $\overline{RAS}$ rises to the "H" level to terminate the active period, a word line driving signal falls to the "L" level. As a result, the transistor QS$_1$ of the memory cell MC$_1$ connected to the selected word line WL$_1$ is turned off. However, the sense amplifiers NSA and PSA are kept active until the start of the next active period. When the row address strobe signal $\overline{RAS}$ becomes "L" level to start the active period, the above described operation is repeated again.

Since the conventional semiconductor dynamic RAM is structured as described above, the charges of one bit line which is at ½ V$_{cc}$ are discharged every time the sense amplifier is activated. Namely, in the above example, the bit line BL having the charges of ½ V$_{cc}$ is connected to the ground power supply through the transistor Q2, the node N1 and the transistor Q3, so that the charges held by the bit line are lost. Therefore, much power is consumed in refreshing and reading.

SUMMARY OF THE INVENTION

An object of the present invention is to provide an economical semiconductor memory device.

Another object of the present invention is to provide a semiconductor memory device having low power consumption.

A further object of the present invention is to provide a semiconductor memory device capable of reducing power consumption in refreshing and reading operation.

A still further object of the present invention is to provide a semiconductor memory device having high sensitivity in detecting potential difference generated between a bit line pair.

In order to attain the above described objects, the semiconductor memory device in accordance with the present invention comprises a first bit line pair, a second bit line pair, connecting means, a sense amplifier and control means. A first memory cell is connected to the first bit line pair and it is employed for inputting and outputting information to and from the first memory cell. A second memory cell is connected to the second bit line pair, and it is used for inputting and outputting information to and from the second memory cell. The connecting means electrically connects each of the bit lines in the first and the second bit line pairs. The sense amplifier is connected to the first bit line pair and amplifies respective potentials to a first potential and to a second potential based on the potential difference generated between the bit lines in the first or second bit line pair. The control means releases the connection between the first and second bit line pairs connected by the connecting means when there is a potential difference generated between the bit lines of the first bit line pair.

In the semiconductor memory device structured as described above, when a memory cell on a bit line pair on the sense amplifier side is selected, the potential of each bit line of the bit line pair on the opposite side is not amplified, thereby reducing the power consumption.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 7 is a diagram of waveforms illustrating the operation of the circuit shown in FIG. 5 in which the word line WL$_5$ is selected.

DESCRIPTION OF THE PREFERRED EMBODIMENTS

Figure 4:
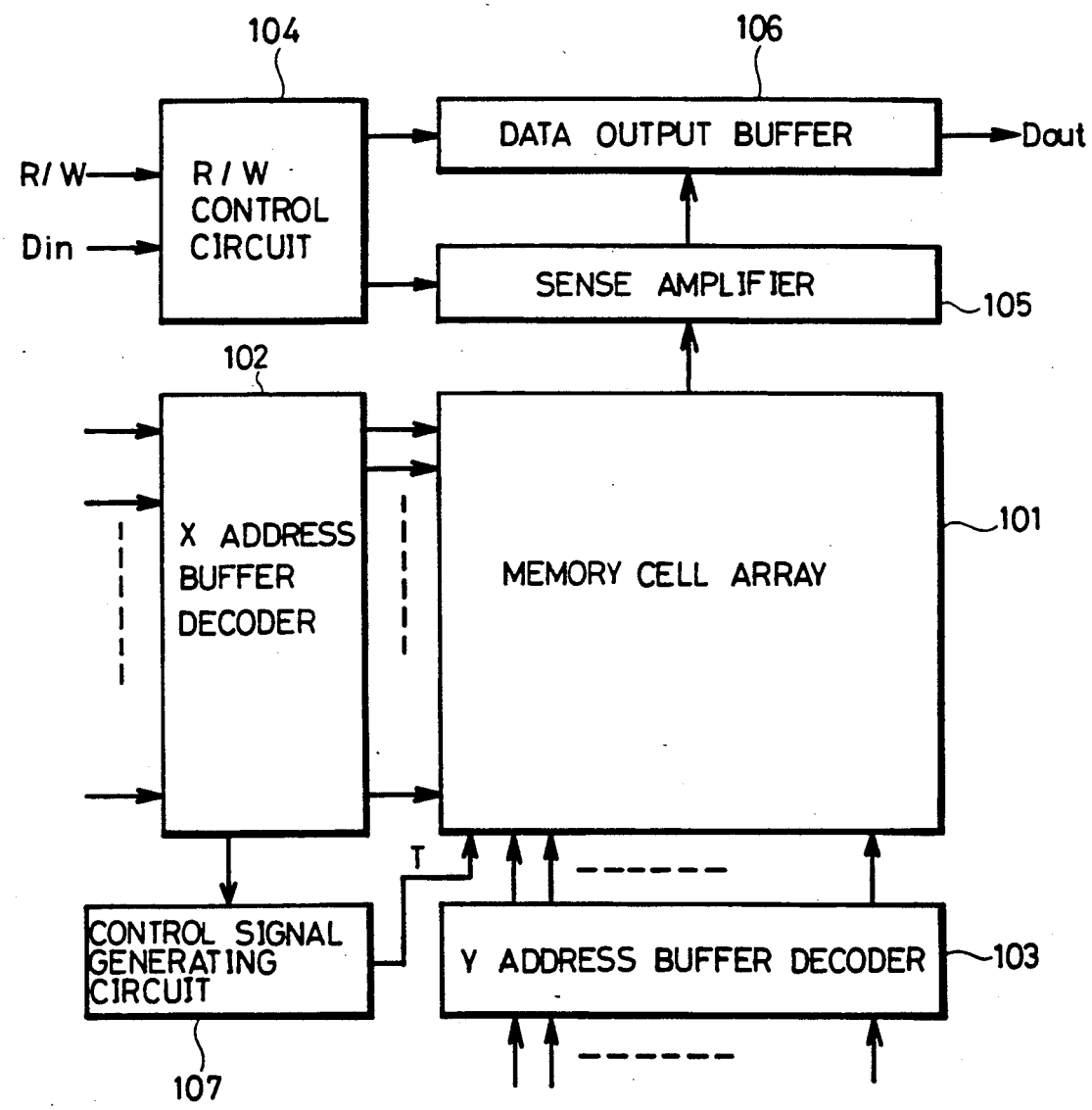
FIG. 4 is a block diagram showing the structure of a DRAM in accordance with one embodiment of the present invention.
Figure 5A:
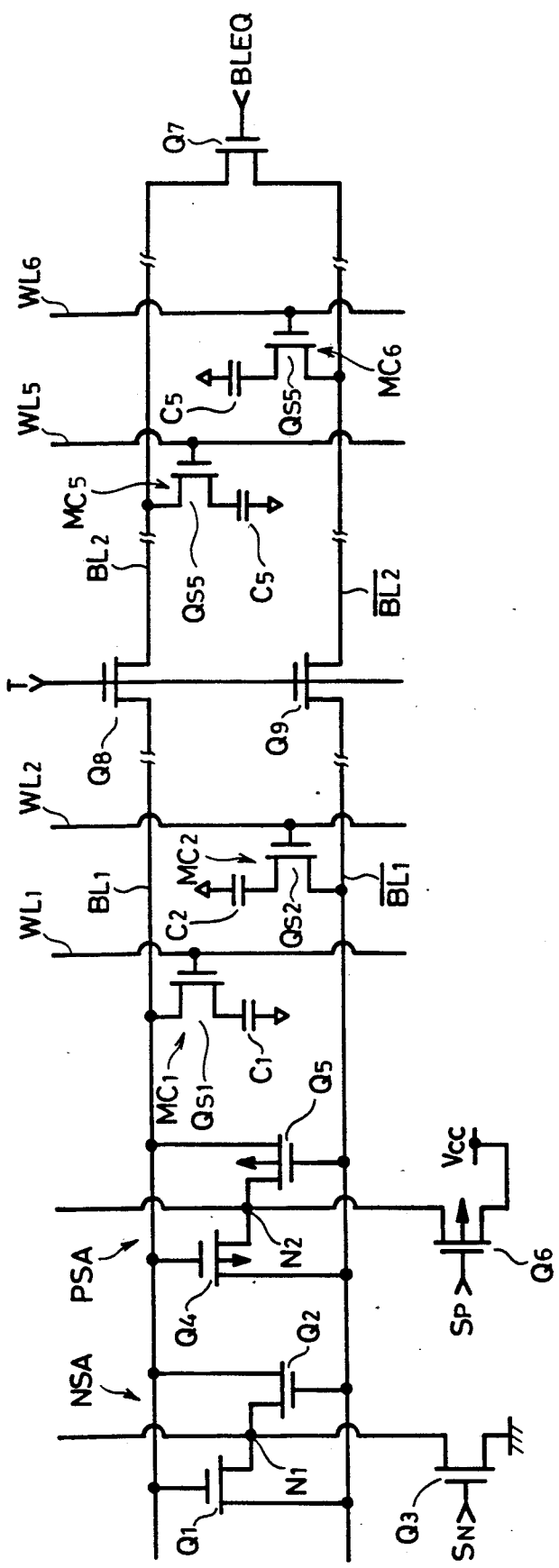
FIG. 5A is a schematic diagram showing a portion of one bit line pair included in the memory cell array of FIG. 4.
Figure 5B:
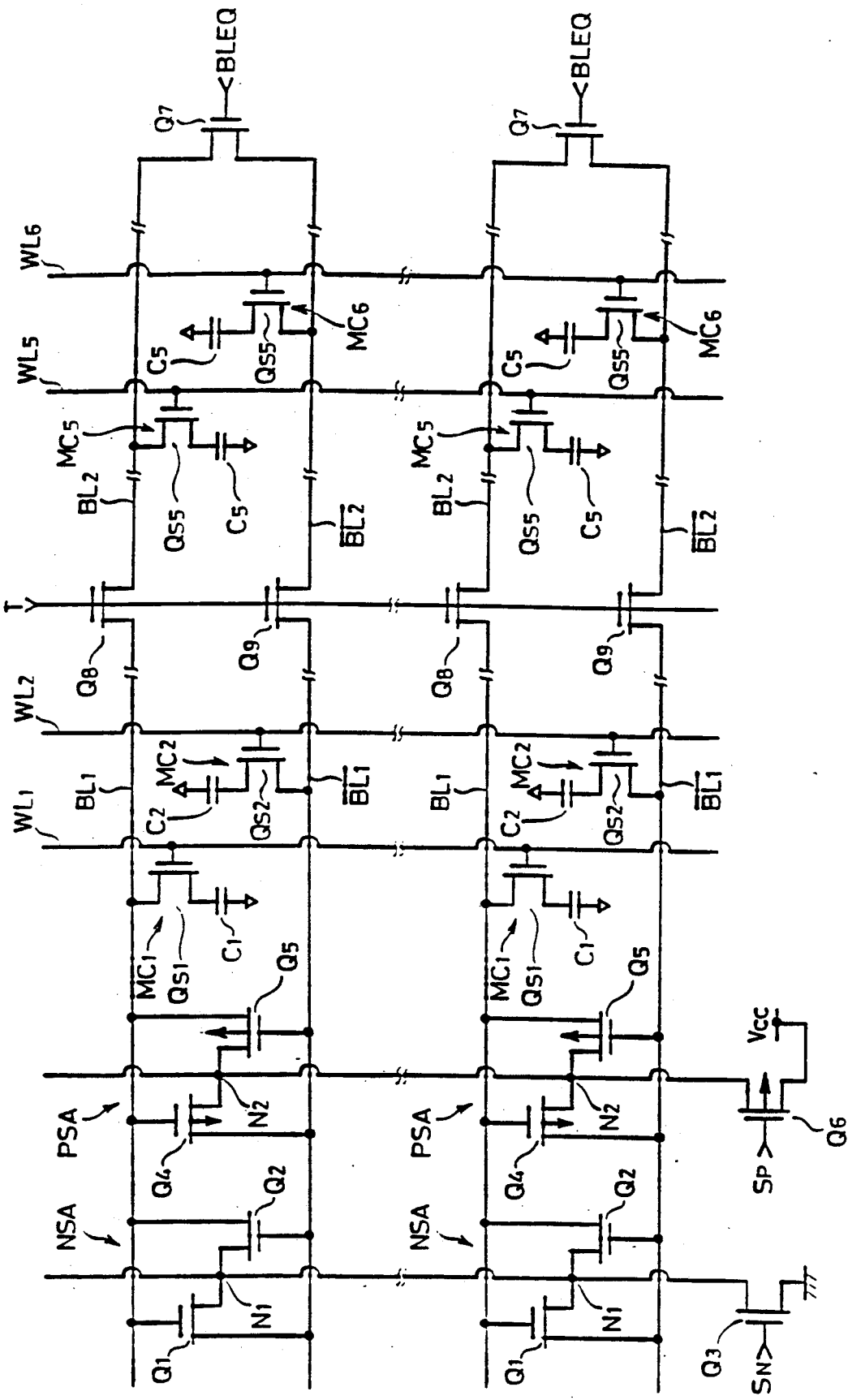
FIG. 5B is a schematic diagram showing a portion of a plurality of sets of bit line pairs.

FIG. 4 is a block diagram showing a DRAM structure in accordance with one embodiment of the present invention and FIGS. 5A and 5B are schematic diagrams showing a portion of one bit line pair and a plurality of bit line pairs respectively of FIG. 4.

Figure 1:
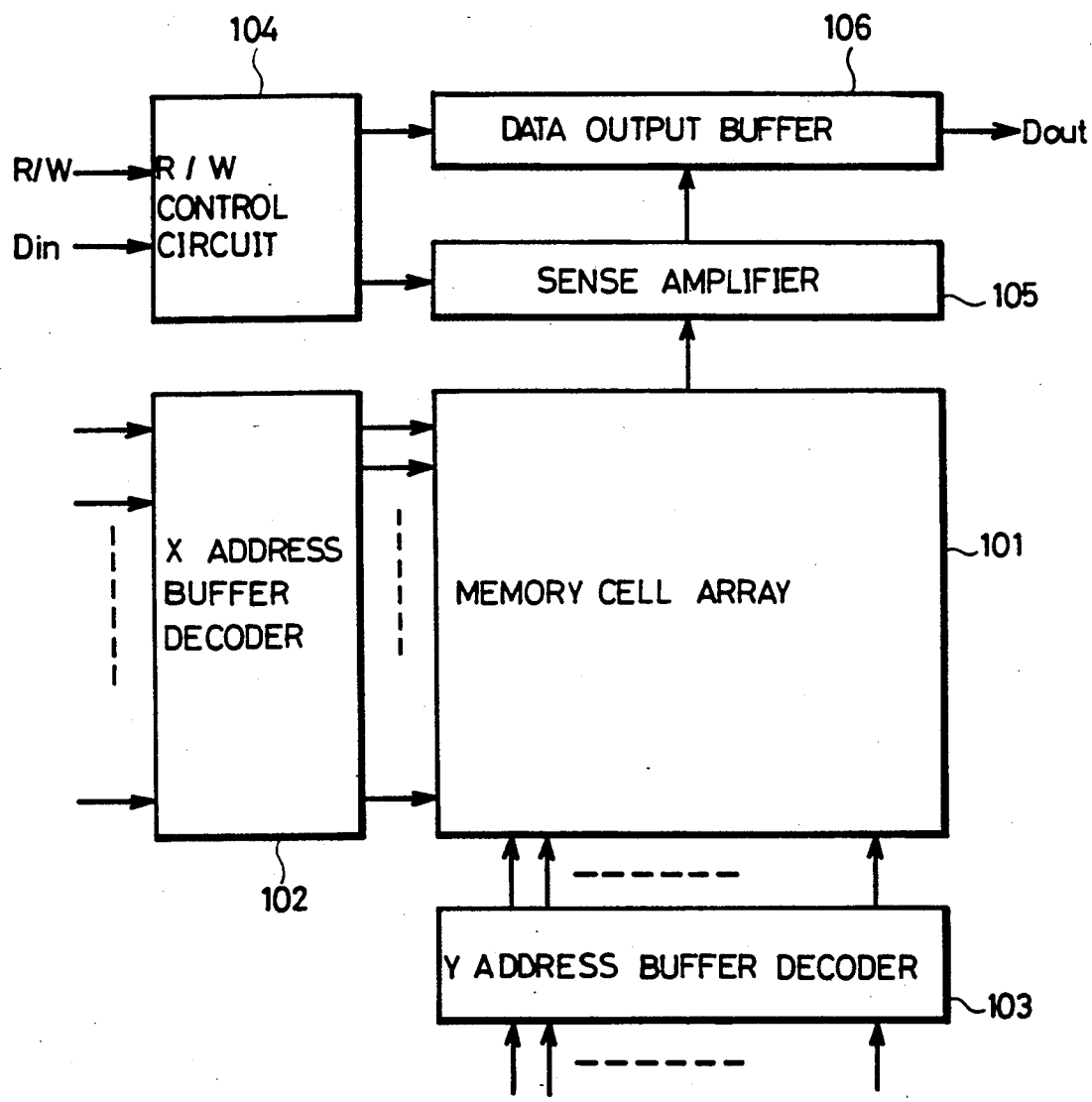
FIG. 1 is a block diagram showing an example of a conventional DRAM structure.
Figure 2:
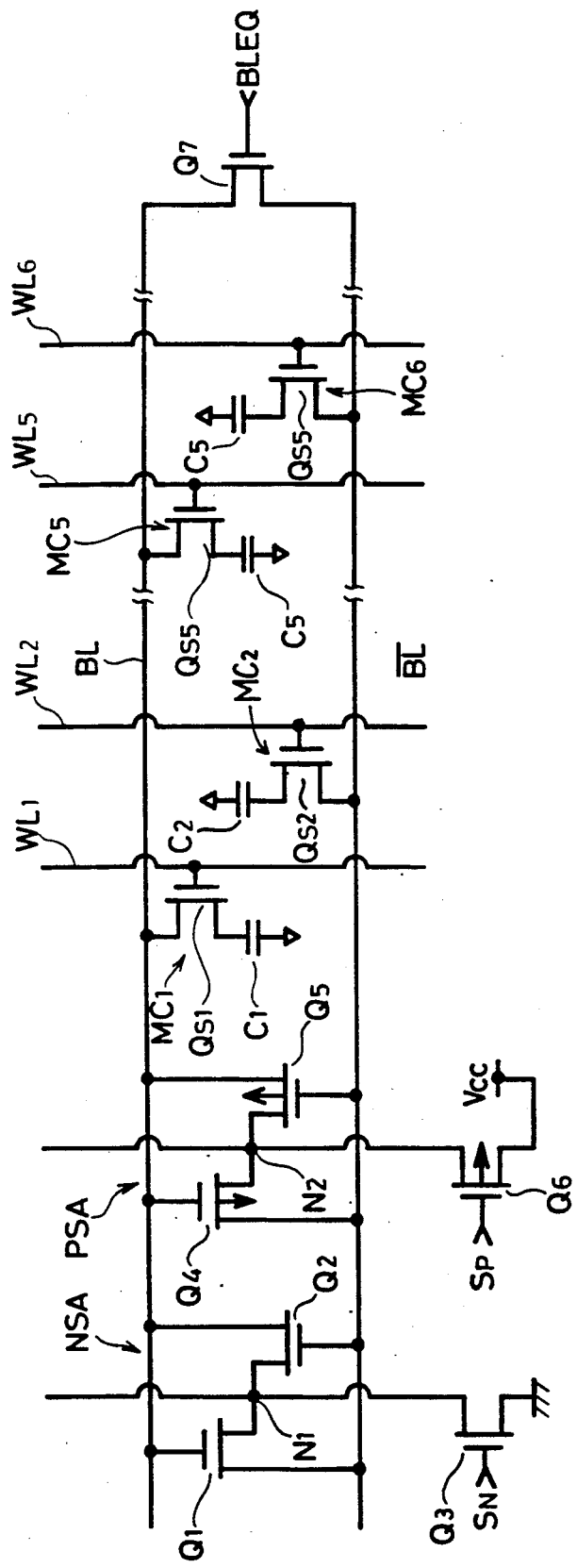
FIG. 2 is a schematic diagram showing a portion of a conventional one bit line pair included in the memory cell array of FIG. 1.
Figure 3:
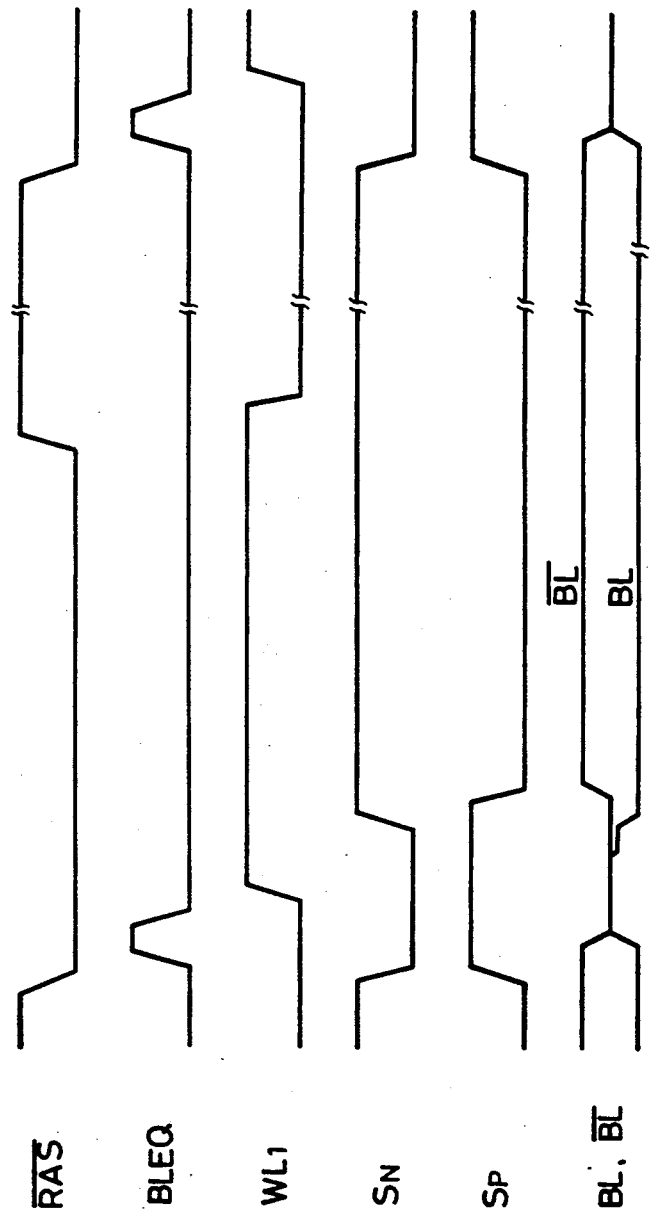
FIG. 3 is a diagram of waveforms showing the operation of FIG. 2.

The present embodiment is the same as the prior art shown in FIGS. 1 and 2 except the following points.

The bit line BL comprises bit lines BL$_1$ and BL$_2$ connected to a transfer transistor Q8 and the bit line $\overline{BL}$ comprises bit lines $\overline{BL_1}$ and $\overline{BL_2}$ connected to a transfer transistor Q9. Control signals T are applied to respective gates of the transistors Q8 and Q9. The control signal T is outputted from a control signal generating circuit 107 in response to a word line selecting signal from a X address buffer decoder 102, as shown in FIG. 4. In this manner, the memory cells MC$_1$ and MC$_2$ and the memory cells MC$_5$ and MC$_6$ are arranged on the left side and the right side separated by the transistors Q$_8$ and Q$_9$. These memory cells and transistors are shown as representatives and other bit lines and word lines are omitted in the figure.

Figure 6:
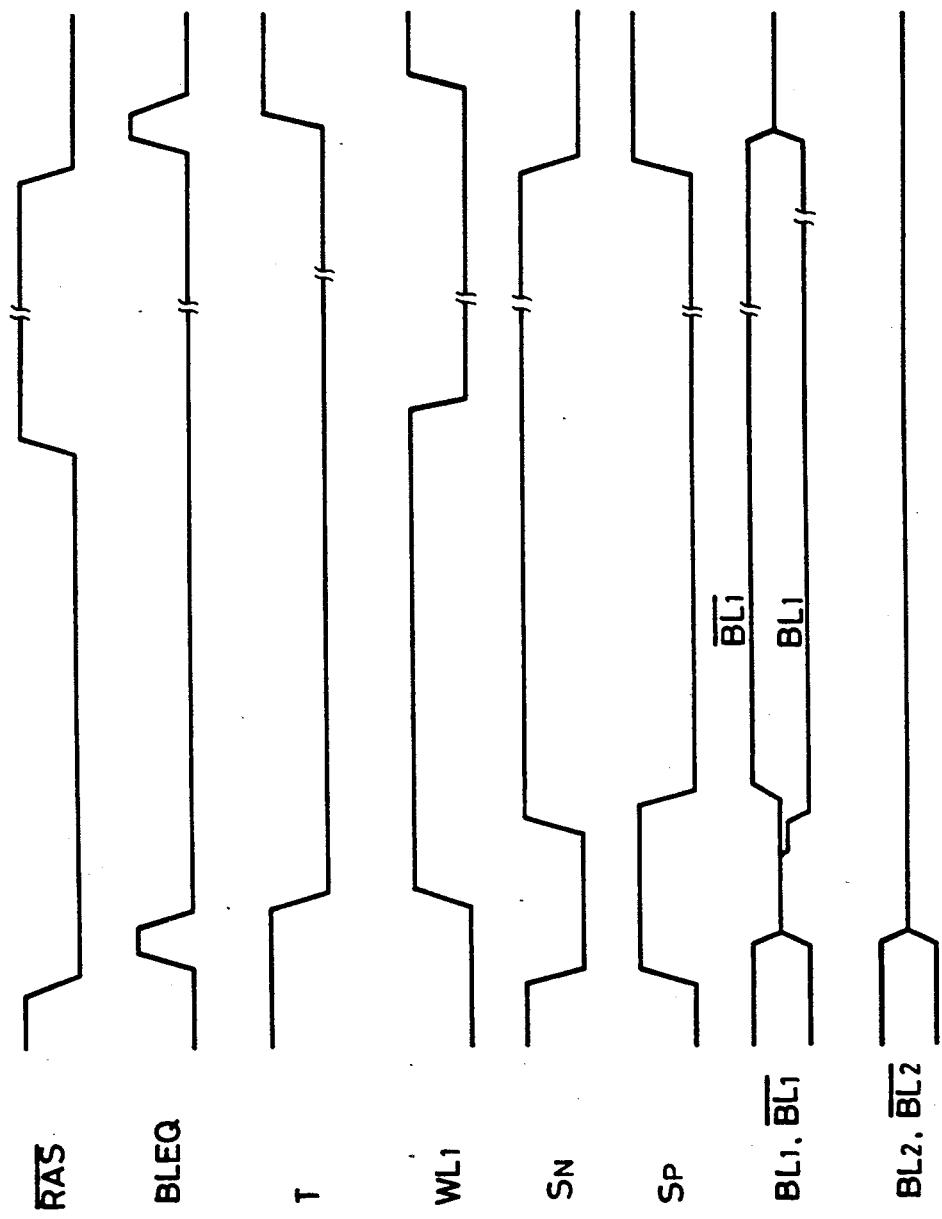
FIG. 6 is a diagram of waveforms illustrating the operation of the circuit shown in FIG. 5, in which the word line WL$_1$ is selected.

FIG. 6 is diagram of waveforms illustrating the operation of the circuit shown in FIG. 5A, showing a case in which the word line WL$_1$ is selected. Namely, it shows an example in which one memory cell between the sense amplifiers NAS and PSA and the transfer transistors Q$_8$ and Q$_9$ is selected. The operation of the circuit shown in FIG. 4 will be described with reference to the waveforms.

When the row address strobe signal $\overline{RAS}$ is at the "H" level, that is, during the off time period, the sense amplifier activating signal S$_N$ becomes "H" level and the sense amplifier activating signal S$_p$ becomes "L" level, so that the sense amplifiers NSA and PSA are in the active state. On this occasion, the control signal T is at the "H" level, so that the transistors Q8 and Q9 are on and the bit lines BL$_1$ and BL$_2$, and $\overline{BL}$, and $\overline{BL2}$ are conductive. When the row address strobe signal $\overline{RAS}$ becomes L level to enter the active period, the sense amplifiers NSA and PSA are brought to the in active state by setting the sense amplifier activating signal S$_N$ at L level and by setting the sense amplifier activating signal $S_P$ at the H level. Thereafter, the equalizing single BLEQ is set at the H level to render the transistor $Q_7$ conductive. On this occasion, since the control signal T is maintained at the H level, the bit lines $BL_1$ and $BL_2$ and the bit lines $\overline{BL_1}$ and $\overline{BL_2}$ which have been at the GND and $V_{cc}$ potential respectively, are equalized to be $\frac{1}{2} V_{cc}$ potential. After the signal BLEQ became L level, the control signal T becomes L level in response to the decoding for selecting the memory cell $MC_1$ of the bit line $BL_1$. Namely, transistors $Q_8$ and $Q_9$ are turned off and the bit lines $BL_1$ and $BL_2$ and the bit lines $\overline{BL_1}$ and $\overline{BL_2}$ are disconnected from each other. Thereafter, the selected word line signal $WL_1$ becomes H level, the charges stored in the memory capacitance $C_1$ are discharged to the bit line $BL_1$ to lower the potential thereof, while the potential $\frac{1}{2} V_{cc}$ of the bit line $BL_2$ remains as it is. Thereafter, when the sense amplifier activating signal $S_N$ is set at the H level and the sense amplifier activating signal $S_P$ is set at the L level, the bit line BL1 of the lower potential is discharged to the GND potential and the bit line $\overline{BL_1}$ of higher potential is charged to the $V_{cc}$ potential. On this occasion, the bit lines $BL_2$ and $\overline{BL_2}$ are neither discharged nor charged and they remain at $\frac{1}{2} V_{cc}$.

The GND potential is again written and held in the memory capacitance $C_1$ in this state by the time when the word line signal $WL_1$ becomes L level. Thereafter, the word line $WL_1$ becomes L level, the sense amplifier activating signal $S_N$ becomes L level and the sense amplifier activating signal $S_P$ becomes H level. Further, the signal BLEQ temporarily becomes H level and the control signal T beomces H level, so that the bit lines $BL_1$ and $\overline{BL_1}$ and the bit lines $BL_2$ and $\overline{BL_2}$ are respectively conducted, and the bit lines $\overline{BL_1}$, $\overline{BL_2}$ and the bit lines $BL_1$ and $BL_2$ are again equalized to the $\frac{1}{2} V_{cc}$ potential.

Through the above described memory cycle, the bit lines $BL_2$ and $\overline{BL_2}$ are maintained at the $\frac{1}{2} V_{cc}$ potential and not discharged. Consequently, the amount of charges to be discharged for all the bit lines can be reduced compared with the prior art.

FIG. 7 is a diagram of waveforms illustrating the operation of the circuit shown in FIG. 5, showing the case in which the word line $WL_5$ is selected.

In response to the decoding for selecting the memory cell $MC_5$ of the bit line $BL_2$, the control signal T maintains the H level. Therefore, the bit lines $BL_1$ and $BL_2$ and the bit liens $\overline{BL_1}$ and $\overline{BL_2}$ are in the normal conductive state, which state is the same as in the prior art. Therefore the operation is completely the same as the prior art, so that the description thereof will be omitted. Either the charges of the bit line $BL_1$ or $\overline{BL_1}$ and the charges of the bit line $BL_2$ or $\overline{BL_2}$ are discharged in this case, so that the power consumption is not reduced. However, in a dynamic RAM having large capacitance, there are a large number of array blocks in which the bit line pairs shown in FIG. 4 are arranged. Therefore, when the memory cells on the bit lines $BL_1$ and $\overline{BL_1}$ are selected in some array blocks and memory cells on the bit lines $BL_2$ and $\overline{BL_2}$ are selected in other array blocks, the power consumption in the whole DRAM can be reduced.

Although the transistor $Q_7$ serving as the equalizing means is arranged on the side opposite to the sense amplifier with the transistors $Q_8$ and $Q_9$ being the center in the above described embodiment, it may be provided on the side of the sense amplifier. In that case, if there are defects on the bit lines $BL_2$ and $\overline{BL_2}$ on the opposite side of the sense amplifier, the transistors $Q_8$ and $Q_9$ can e always kept off to bring the bit lines $BL_2$ and $\overline{BL_2}$ to the ground potential. By doing so, the reading and writing to and from the memory cells connected to the bit lines $BL_2$ and $\overline{BL_2}$ become impossible. However, the DRAMs having such defects can be employed as DRAMs having smaller bit number, whereby the production yield can be improved.

The sense amplifier is connected to one of the bit line pairs connected to the transistors $Q_8$ and $Q_9$ in the above described embodiment, two sense amplifiers may be provided to be connected to both bit line pairs.

As described above, according to the present invention, a transfer transistor is provided on the bit line, whereby the transfer transistor is turned on when a memory cell between the sense amplifier and the transfer transistor is selected. Consequently, the amount of charges of the bit line discharged in amplification can be reduced, providing a semiconductor dynamic RAM having lower power consumption.

When a memory cell of a bit line pair connected to the sense amplifier is selected, the potential only of that bit line pair is changed, so that the potential difference between the bit lines becomes large, improving the detection sensitivity.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
   first and second memory cells;
   a first bit line pair connected to said first memory cell for inputting and outputting information to and from said first memory cell;
   a second bit line pair connected to said second memory cell for inputting and outputting information to and from said second memory cell;
   connecting means for electrically connecting to each other respective bit lines of said first and second bit line pairs;
   amplifying means connected to said first bit line pair remote from the connection of said first bit line pair with said for amplifying respective potentials on said first and said second bit line pairs to a first potential and to a second potential based on a potential difference generated between respective bit lines of said first or second bit line pairs, said first memory cell being located between said amplifying means and said connecting means;
   accessing means for accessing selected memory cells for an accessing period;
   activation means for activating said amplifying means subsequent to the start of said accessing period; and
   control means releasing connection of said first and second bit line pairs by said connecting means before said amplifying means is activated and maintaining disconnection between said first and second bit line pairs thereafter throughout said accessing period in response to selection of said first memory cell.

2. A semiconductor memory device according to claim 1, comprising a plurality of sets of bit lines pairs, wherein each of sets of the bit line pairs is constituted by said first and second bit line pairs.

3. A semiconductor memory device according to claim 1, wherein said control means comprises transistors connected between respective bit lines of said first bit line pair and said second bit line pair.

4. A semiconductor memory device as recited in claim 1, wherein said first and second bit line pairs are connected to each other when a potential difference is generated by said second memory cell to apply the second memory cell potential difference to said amplifying means.

5. A semiconductor memory device comprising:
  a plurality of memory cells storing information written therein;
  a set of bit line pairs comprising a first bit line pair corresponding to at least one of said memory cells and a second bit line pair corresponding to another one of said memory cells for writing information in said corresponding memory cells or for reading information stored in said corresponding memory cell;
  selecting means for selecting any one of said memory cells during an accessing period;
  connecting means for electrically connecting to each other respective bit lines of said first and second bit line pairs;
  amplifying means connected to said first bit line pair for amplifying potentials of said first and second bit line pairs in correspondence with the memory cell selected by said selecting means to a first potential and to a second potential, respectively, said amplifying means and said connecting means being separated by memory cells corresponding to said first bit line pair;
  determining means for determining which of said first bit line pair and said second bit line pair corresponds to the memory cell selected by said selecting means; and
  control means for controlling connection of said first and second bit line pairs to each other in response to a determining output of said determining means;
  said control means comprising releasing means for releasing connection of said first and second bit line paris before said amplifying means is activated in response to an indication from said determining means that a memory cell corresponding to said first bit line pair has been selected and for maintaining disconnection between said first and second bit line pairs thereafter throughout said accessing period.

6. A semiconductor memory device according to claim 5, wherein said control means comprises transistors connected between respective bit lines of said first bit line pair and said second bit line pair, said transistor rendered conductive or non-conductive in response to the determining output of said determining means.

7. A semiconductor memory device according to claim 6, wherein said first bit line pair is connected to said amplifying means, and
  said transistors turn off when the memory cell corresponding to said first bit line pair is selected by said selecting means, and turn on when the memory cell provided corresponding to said second bit line pair is selected by said selecting means.

8. A semiconductor memory device according to claim 5, wherein
  said first potential is a power supply potential and said second potential is ground potential.

9. A semiconductor memory device according to claim 5, further comprising
  equalizing means connected to said bit line pairs for equalizing, when writing or reading of information to and from the memory cell is to be carried out, potentials of said first or second bit line pair corresponding to the memory cell.

10. A semiconductor memory device according to claim 9, wherein
  said first bit line pair and said second bit line pair are connected by said control means when said equalizing means is activated.

11. A semiconductor memory device as recited in claim 5, wherein said first and second bit line pairs are connected to each other when a second memory cell corresponding to said second bit line pair is selected to apply a potential difference generated by said second memory cell to said amplifying means.

* * * * *